US009673020B2

United States Patent
Ominami et al.

(10) Patent No.: US 9,673,020 B2
(45) Date of Patent: Jun. 6, 2017

(54) CHARGED PARTICLE BEAM DEVICE, METHOD FOR ADJUSTING CHARGED PARTICLE BEAM DEVICE, AND METHOD FOR INSPECTING OR OBSERVING SAMPLE

(71) Applicant: HITACHI HIGH-TECHNOLOGIES CORPORATION, Tokyo (JP)

(72) Inventors: Yusuke Ominami, Tokyo (JP); Tomohisa Ohtaki, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/850,085

(22) Filed: Sep. 10, 2015

(65) Prior Publication Data

US 2015/0380208 A1 Dec. 31, 2015

Related U.S. Application Data

(63) Continuation of application No. 14/235,892, filed as application No. PCT/JP2012/067035 on Jul. 4, 2012, now Pat. No. 9,165,741.

(30) Foreign Application Priority Data

Sep. 21, 2011 (JP) .................................. 2011-205499

(51) Int. Cl.
  *H01J 37/18* (2006.01)
  *H01J 37/28* (2006.01)
  (Continued)

(52) U.S. Cl.
  CPC .............. *H01J 37/18* (2013.01); *H01J 37/06* (2013.01); *H01J 37/244* (2013.01); *H01J 37/28* (2013.01);
  (Continued)

(58) Field of Classification Search
  CPC combination set(s) only.
  See application file for complete search history.

(56) References Cited

U.S. PATENT DOCUMENTS 5,811,803 A 9/1998 Komatsu et al.
6,140,755 A 10/2000 Neukermans et al.
(Continued)

FOREIGN PATENT DOCUMENTS

DE 102007021897 A1 11/2008
JP 51-42461 A 4/1976
(Continued)

OTHER PUBLICATIONS

Translation of German Office Action received in corresponding German Application No. DE11 2012 003 182.2 dated Mar. 27, 2015.

*Primary Examiner* — Phillip A Johnston
*Assistant Examiner* — Hsien Tsai
(74) *Attorney, Agent, or Firm* — Mattingly & Malur, PC

(57) ABSTRACT

A charged particle beam device capable of observing a sample in an air atmosphere or gas atmosphere has a thin film for separating the atmospheric pressure space from the decompressed space. A vacuum evacuation pump evacuates a first housing; and a detector detects a charged particle beam (obtained by irradiation of the sample) in the first housing. A thin film is provided to separate the inside of the first housing and the inside of a second housing at least along part of the interface between the first and second housings. An opening part is formed in the thin film so that its opening area on a charged particle irradiation unit's side is larger than its opening area on the sample side; and the thin film which covers the sample side of the opening part transmits or allows through the primary charged particle beam and the charged particle beam.

16 Claims, 12 Drawing Sheets

(51) Int. Cl.
*H01J 37/06* (2006.01)
*H01J 37/244* (2006.01)

(52) U.S. Cl.
CPC ... *H01J 2237/164* (2013.01); *H01J 2237/166* (2013.01); *H01J 2237/18* (2013.01); *H01J 2237/202* (2013.01); *H01J 2237/2445* (2013.01); *H01J 2237/2608* (2013.01)

(56) References Cited

U.S. PATENT DOCUMENTS

| | | | |
|---|---|---|---|
| 6,224,445 B1 | 5/2001 | Neukermans et al. | |
| 2005/0218336 A1* | 10/2005 | Mori | H01J 37/3171 250/440.11 |
| 2008/0308731 A1* | 12/2008 | Nishiyama | H01J 37/20 250/310 |
| 2009/0066031 A1 | 3/2009 | McRay et al. | |
| 2009/0166536 A1 | 7/2009 | Suga et al. | |

FOREIGN PATENT DOCUMENTS

| | | |
|---|---|---|
| JP | 64-35654 U | 3/1989 |
| JP | 02-138900 A | 5/1990 |
| JP | 05-234552 A | 9/1993 |
| JP | 06-242299 A | 9/1994 |
| JP | 08-240542 A | 9/1996 |
| JP | 10-064467 A | 3/1998 |
| JP | 2000-512794 A | 9/2000 |
| JP | 2004-170353 A | 6/2004 |
| JP | 2006-147430 A | 6/2006 |
| JP | 2009-158222 A | 7/2009 |
| WO | 2010/001399 A1 | 1/2010 |

\* cited by examiner

CHARGED PARTICLE BEAM DEVICE, METHOD FOR ADJUSTING CHARGED PARTICLE BEAM DEVICE, AND METHOD FOR INSPECTING OR OBSERVING SAMPLE

CROSS-REFERENCE TO RELATED APPLICATION

This application is a continuation application of U.S. application Ser. No. 14/235,892, filed Jan. 29, 2014, which is a 371 application of PCT/JP2012/067035 filed Jul. 4, 2012, the entirety of the contents and subject matter of all of the above is incorporated herein by reference.

TECHNICAL FIELD

The present invention relates to technology for charged particle beam devices.

In particular, the present invention relates to technology for charged particle beam devices capable of observing a sample (observation target) under the atmospheric pressure or in a prescribed gas atmosphere.

BACKGROUND ART

Scanning electron microscopes (SEMs), transmission electron microscopes (TEMs), etc. are widely used for observing minute areas on objects. In such devices, images of a sample are captured generally by keeping the sample atmosphere (atmosphere around the sample) in a vacuum state by vacuum evacuating a second housing storing the sample. Meanwhile, there are increasing needs for observing samples that are damaged or changed by the vacuum (biochemical samples, liquid samples, etc.) by use of an electron microscope. In recent years, SEM devices, sample holding devices, etc. that make it possible to observe samples (observation targets) under the atmospheric pressure are being developed.

In principle, such devices separate the vacuum state and the atmospheric state from each other by arranging a thin film that allows through the electron beam between the electronic optical system and the sample. The arrangement of the thin film between the electronic optical system and the sample is common to such devices.

Patent Literatures 1-3 have described atmospheric pressure SEM devices in which the thin film allowing through the electron beam is arranged in the vicinity of the sample and is used for separating the vacuum state and the atmospheric pressure state from each other for the purpose of observing a sample or liquid placed under the atmospheric pressure.

PRIOR ART LITERATURE

Patent Literature

Patent Literature 1: JP-05-234552-A
Patent Literature 2: JP-10-064467-A
Patent Literature 3: JP-2006-147430-A

SUMMARY OF THE INVENTION

Problem to be Solved by the Invention

However, the present inventors found out that the inventions described in the Patent Literatures 1-3 involve some technical problems in regard to the configuration for holding the thin film, etc.

Specifically, in order to efficiently detect electrons emitted from the sample, the emission electron transmitting area (area allowing through the emission electrons) of the thin film has to be enlarged. However, simply enlarging the emission electron transmitting area of the thin film makes it impossible to secure necessary strength of the thin film.

The object of the present invention, which has been made in consideration of the above problem, is to provide a charged particle beam device, a method for adjusting the charged particle beam device, and a method for inspecting or observing a sample that make it possible to observe a sample (observation target) in the air atmosphere or in a gas atmosphere by optimizing the configuration in the vicinity of the thin film for separating the atmospheric pressure space and the decompressed space from each other.

Means for Solving the Problem

According to an aspect of the present invention, there is provided a charged particle beam device comprising: a charged particle irradiation unit which irradiates a sample with a primary charged particle beam emitted from a charged particle source; a first housing which is configured to support the charged particle irradiation unit and to be capable of maintaining the inside of the housing in a vacuum state; a second housing which is provided in addition to the first housing and stores the sample; an evacuation device which evacuates the inside of the first housing; a detector which detects a charged particle beam obtained by the irradiation in the first housing; a partition wall part which is formed as at least part of either the first or second housing or separately from the first and second housings so as to separate the inside of the first housing and the inside of the second housing from each other at least along part of the interface between the first and second housings; an opening part which is formed in the partition wall part so that its opening area on the charged particle irradiation unit's side is larger than its opening area on the sample's side; and a thin film which covers the sample's side of the opening part and transmits or allows through the primary charged particle beam and the charged particle beam.

According to another aspect of the present invention, there is provided a method for adjusting the charged particle beam device.

According to another aspect of the present invention, there is provided a method for inspecting or observing a sample by applying a primary charged particle beam emitted by a charged particle source of a charged particle irradiation unit from a first housing which is maintained in a vacuum state to the sample stored in a second housing which is provided in addition to the first housing. A partition wall part is formed as at least part of either the first or second housing or separately from the first and second housings so as to separate the inside of the first housing and the inside of the second housing from each other at least along part of the interface between the first and second housings. The primary charged particle beam passes through an opening part which is formed in the partition wall part so that its opening area on the charged particle irradiation unit's side is larger than its opening area on the sample's side. The primary charged particle beam penetrates or passes through a thin film covering the sample's side of the opening part and irradiates the sample. A charged particle beam from the sample penetrates or passes through the thin film, passes through the opening part, and is detected by a detector in the first housing.

Effect of the Invention

According to the present invention, the thin film to be irradiated with charged particles and to allow through charged particles can be arranged in an optimum manner. Consequently, a charged particle beam device, a method for adjusting the charged particle beam device, and a method for inspecting or observing a sample, offering more practicality than ever before and making it possible to observe samples in the atmospheric pressure atmosphere, can be provided.

MODE FOR CARRYING OUT THE INVENTION

While the following explanation will be given by taking a SEM device employing an electron beam as an example of a charged particle beam device, it goes without saying that the present invention is applicable also to other types of charged particle beam devices such as a SIM (Scanning Ion Microscope) detecting secondary electrons and reflected electrons by irradiating the sample with an ion beam and an ion microscope employing an ion beam of a light element. The embodiments described below may be properly combined together within the extent not departing from the spirit and scope of the present invention.

<First Embodiment>

Figure 1:
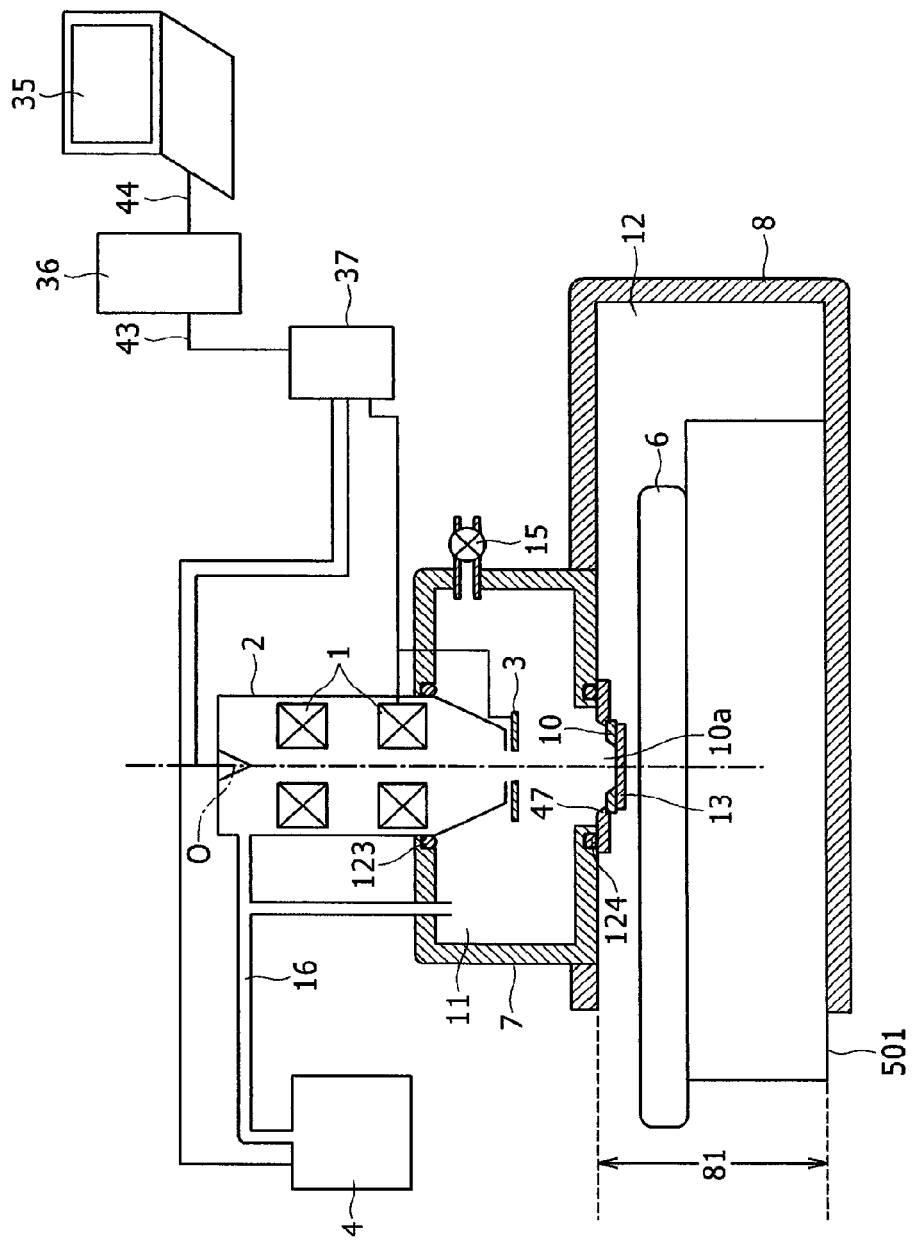
FIG. 1 is a schematic diagram showing the overall configuration of a charged particle beam device as a first embodiment of the present invention.

FIG. 1 is a schematic diagram showing the overall configuration of a charged particle beam device as a first embodiment of the present invention. The device shown in FIG. 1 is a scanning microscope which images a sample 6 by scanning a charged particle beam on the sample 6 and detecting secondary electrons or reflected electrons obtained by the scanning. The device of FIG. 1 is illustrated as an example of a charged particle beam device which irradiates the sample with a primary charged particle beam emitted from a charged particle source and detects a charged particle beam obtained by the irradiation.

The charged particle beam device is roughly composed of an electronic optical body tube 2, a first housing 7 which supports the electronic optical body tube 2, a second housing 8 which stores the sample 6, a thin film 13 which transmits (allows through) a primary electron beam and the secondary electrons or reflected electrons obtained from the sample 6, a thin film holding part 10 which holds the thin film, and a thin film holding part support 47 which is formed in a partition wall part (as the lower surface of the first housing 7) and supports the thin film holding part. The electronic optical body tube 2 is arranged to project into the inside of the first housing 7. A detector 3 for detecting the secondary electrons or reflected electrons is arranged on an end of the electronic optical body tube 2. The detector 3 is configured to detect the secondary electrons or reflected electrons (obtained by the irradiation of the sample 6 with the primary electron beam emitted from the electronic optical body tube 2) inside the first housing 7. Although not illustrated, a detector for detecting X-rays or photons may be arranged in a first space 11 inside the first housing 7 instead of the detector for detecting the secondary electrons or reflected electrons. It is also possible to arrange both the detector for detecting the reflected electrons and the detector for detecting the X-rays or photons.

The chain line in FIG. 1 represents the optical axis of the primary electron beam. The electronic optical body tube 2, the first housing 7 and the thin film 13 are assembled together to be coaxial with the primary electron beam optical axis.

Provided as the control system of the device are a personal computer 35 which is used by the user of the device, an upper-level control unit 36 which is connected to the personal computer 35 to perform communication, and a lower-level control unit 37 which controls a vacuum evacuation system, an electronic optical system, etc. according to commands transmitted from the upper-level control unit 36. The personal computer 35 has a monitor for displaying operation screens (GUI) of the device and input means (keyboard, mouse, etc.) to be used for inputting information to the operation screens. The upper-level control unit 36, the lower-level control unit 37 and the personal computer 35 are connected together by communication lines 43 and 44. The lower-level control unit 37 is a part for transmitting and receiving control signals for controlling a vacuum evacuation pump 4, a gas control valve 101, a charged particle source 0, optical lenses 1, etc. Further, the lower-level control unit 37 converts the output signal of the detector 3 into a digital image signal and transmits the digital image signal to the upper-level control unit 36. The upper-level control unit 36 and the lower-level control unit 37 may include analog circuits, digital circuits, etc. The upper-level control unit 36 and the lower-level control unit 37 may also be integrated into one unit. Incidentally, the configuration of the control system shown in FIG. 1 is just an example for illustration; a variety of modifications (modified examples) regarding the control units, the valve, the vacuum evacuation pump, the communication lines, etc. belong to the category of the SEM or charged particle beam device of this embodiment as long as the functions intended by this embodiment are satisfied.

The electronic optical body tube 2 as an electron irradiation unit houses the electronic optical system inside. The electronic optical system includes the charged particle source 0 for emitting the primary electron beam, various optical lenses 1 for controlling the course (path) of the electron beam, various deflectors for deflecting the course of the electron beam, etc.

In cases where the device is a SIM or an ion microscope, for example, a charged particle optical body tube, a charged particle optical system and an ion source are used instead of the electronic optical body tube 2, the electronic optical system and an electron source. The aforementioned various optical lenses and various deflectors are made up of electrostatic lenses and/or electrostatic deflectors. This is because the use of lenses/deflectors of the magnetic field type causes the mass separation in the case where an ion beam is used.

The inside of the electronic optical body tube 2 and the first housing 7 (more precisely, the closed space formed by surfaces of the first housing 7 and the electronic optical body tube 2) is configured so that the space is evacuated by the vacuum evacuation pump 4 and the pressure in the space is maintained practically in the vacuum state at least when the device is in operation. Therefore, a joining part of the first housing 7 facing the electronic optical body tube 2 is provided with a vacuum sealing member 123, and a joining part of the lower surface of the first housing 7 facing the thin film holding part support 47 is provided with a vacuum sealing member 124. In contrast, the second housing 8 has a sample gateway part 81 (or an opening surface) for opening the inside of the second housing 8 to the atmospheric air. The inside of the second housing 8 is constantly opened to the atmospheric air during the observation of the sample.

In the following explanation, the space inside the first housing 7 and the space inside the second housing 8 can be referred to also as a first space 11 and a second space 12, respectively. The first space 11 includes the path of the primary electron beam before passing through the thin film 13. The second space 12 includes the path of the primary electron beam after passing through the thin film 13.

The lower surface of the first housing 7 does not necessarily have to be formed integrally with the first housing 7. For example, the lower surface of the first housing 7 may also be formed by the upper surface of the second housing 8, formed by both the lower surface of the first housing 7 and the upper surface of the second housing 8, or formed as a part separate from the first housing 7 and the second housing 8. In short, the lower surface of the first housing 7 may be configured as a partition wall part which is formed as at least part of either the first housing 7 or the second housing 8 or separately from the first and second housings 7 and 8 so as to separate the inside of the first housing 7 and the inside of the second housing 8 from each other.

The second housing 8 may either be formed to adjoin the first housing 7 or as a part of the first housing 7.

While only one vacuum evacuation pump 4 is used for evacuating the inside of the electronic optical body tube 2 and the inside of the first housing 7 in the example of FIG. 1, it is also possible to use two or more vacuum pumps to evacuate the electronic optical body tube 2 and the first housing 7 independently. Further, while a pipe 16 is connected to both the electronic optical body tube 2 and the first housing, it is also possible to use separate pipes for the connection. The number of pipes can be changed from that in this example.

The first housing 7 is equipped with a leak valve 15 and the inside of the first housing is opened to the atmospheric air when the device is stopped. The position of the leak valve 15 in the first housing 7 is not particularly limited. The first housing 7 may also be configured to have two or more leak valves 15. However, the first housing 7 does not necessarily have to be equipped with the leak valve 15.

The thickness of the thin film 13 is preferably 20 μm or less. This is because the thickness through which the electron beam can pass is approximately 20 μm in cases of using an electron gun whose acceleration voltage is approximately some tens of kilovolts (practical in a SEM).

The sample 6 is set on a sample table 501 and is stored in the second housing 8. Sample tables 501 having various thicknesses are prepared. From the prepared sample tables, an appropriate sample table is selected based on the thickness of the sample 6 as the observation target and is stored in the second housing 8. This operation has to be performed manually. By the manual operation, the inter-surface distance between the thin film 13 and the sample 6 as the observation target can be adjusted to an appropriate distance.

The sample gateway part 81 is formed in a lateral part of the second housing 8. Thanks to the sample gateway part 81, even a large sample protruding from the housing as shown in FIG. 1 can be set in the housing. Since the inside of the second housing 8 is constantly opened to the atmospheric air, it is possible to insert a hand into the inside of the housing through the sample gateway part 81 even during the SEM observation. By moving the sample table 501, the observation position of the sample 6 can be changed during the SEM observation.

Next, the part in the vicinity of the thin film 13 shown in FIG. 1 will be explained in more detail.

The part in the vicinity of the thin film 13 includes the thin film 13 which transmits (allows through) the primary electron beam and the secondary electrons or reflected electrons obtained from the sample, the thin film holding part 10 which holds the thin film, and the thin film holding part support 47 which is formed in the partition wall part (as the lower surface of the first housing 7) and supports the thin film holding part.

The thin film 13 is placed in close contact with the thin film holding part 10 so as to maintain the hermeticity of the first space 11.

The thin film 13 is formed of carbon material, organic material, inorganic material, silicon carbide, silicon oxide film, silicon nitride film, light element film (e.g., beryllium) or metallic film, for example.

While the thin film 13 shown in FIG. 1 entirely covers the lower surface of the thin film holding part 10, the thin film 13 has only to be slightly larger than the opening part 10a (second space 12's side) of the thin film holding part 10. In short, it is enough if the thin film 13 is formed to be capable of maintaining the hermeticity of the first space 11.

Since the thin film 13 is required to transmit (allow through) the electron beam, the thin film 13 is desired to be thinner than the thickness as the limit of transmission determined by the transmissibility of the electron beam. On the other hand, the area of the thin film 13 is desired to be as small as possible since the thin film 13 is required to have sufficient pressure resistance for the separation between the vacuum and the atmospheric pressure.

Meanwhile, the detector 3 for detecting the electrons emitted from the sample 6 is arranged to perform the detection in the first space 11 as mentioned above. In order to allow the detector 3 to efficiently collect the emission electrons from the sample 6 irrespective of the position of detection in the first space 11 and the shape of the detector 3, the emission electron transmitting area of the thin film (i.e., the area of the opening part 10a of the thin film holding part 10) has to be set large. However, simply increasing the opening area of the opening part 10a makes it difficult to secure the sufficient pressure resistance of the thin film 13 (arranged on the second space 12's side of the thin film holding part 10 as explained above) for the separation between the vacuum and the atmospheric pressure. In consideration of this problem, the opening part 10a of the thin film holding part 10 is configured so that its opening area on the first space 11's side (charged particle irradiation unit's side) is larger than its opening area on the second space 12's side (sample's side). With this configuration, the emission electrons from the sample 6 can be detected efficiently while also securing the strength of the thin film 13.

Next, the operation will be described below.

The primary electron beam emitted from the electron source 0 passes through the first housing 7 (the inside of which is maintained in the vacuum state). The primary charged particle beam passes through the opening part 10a, penetrates or passes through the thin film 13 covering the sample 6's side of the opening part 10a, and irradiates the sample 6 stored in the second housing 8. The secondary electrons or reflected electrons from the sample 6 penetrate or pass through the thin film 13 and are detected by the detector 3 inside the first housing 7. By the above operation, the sample can be observed.

<Second Embodiment>

Figure 2:
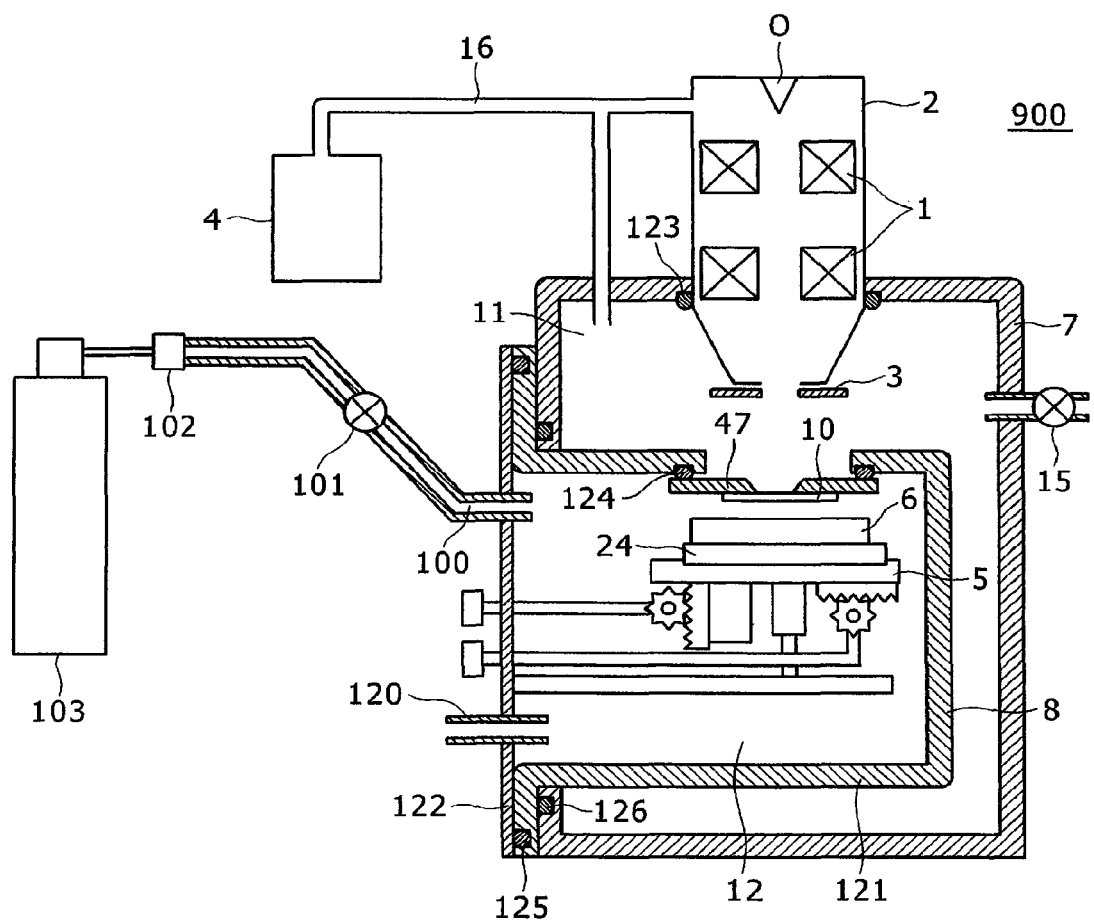
FIG. 2 is a schematic diagram showing the overall configuration of a charged particle beam device as a second embodiment of the present invention.

FIG. 2 is a schematic diagram showing the overall configuration of a scanning microscope (hereinafter referred to as a "SEM device") 900 (example of the charged particle beam device) as a second embodiment of the present invention. Main differences from the first embodiment are the shapes of the first and second housings 7 and 8, a blocking part 122 for the separation from the external space of the SEM device, a gas nozzle 100 for discharging gas from the second space 12, a gas control valve 101 arranged in a gas pipe connected to the gas nozzle 100 in order to control the gas discharge, a gas outlet 120 for discharging the gas from the second space 12, and a sample stage 5 for holding and moving (driving) the sample 6. The other configuration is equivalent to that in the first embodiment. Especially, illustration of components in common with the first embodiment (e.g., the personal computer 35) is omitted for brevity.

In the following explanation, the first housing 7 and the second housing 8 can be referred to also as a first separation part and a second separation part, respectively.

Incidentally, the second housing 8 may either be formed to adjoin the first housing 7 or as a part of the first housing 7. Further, the first and second housings 7 and 8 may also be formed so that the second housing 8 is contained/stored in the first housing 7 or the first housing 7 is contained/stored in the second housing 8.

The first housing 7 is formed so as to separate the first space 11 from the external space 901 of the SEM device 900.

Further formed in the SEM device are the second housing 8 for the separation between the first space 11 and the second space 12 (more precisely, a separation part 121, the thin film holding part support 47 and the thin film holding part 10), the blocking part 122 for the separation between the second space 12 and the external space 901 of the SEM device (also referred to as a "blocking part for blocking the sample gateway"), sealing parts 123 and 126 for the separation of pressure status between the first space 11 and the external space 901 of the SEM device 900, a sealing part 124 for the separation of pressure status between the first space 11 and the second space 12, and a sealing part 125 for the separation of pressure status between the second space 12 and the external space 901 of the SEM device 900. In the following explanation, the blocking part 122 can be referred to also as a third separation part.

In FIG. 2, the sample stage 5 is connected to the blocking part 122. The sample stage 5 is equipped with a drive mechanism capable of changing at least the distance between the sample 6 and the thin film holding part 10.

In this embodiment, the SEM device is equipped with a function of supplying a replacement gas to the second space 12.

Specifically, the SEM device is equipped with components such as the gas nozzle 100, the gas control valve 101 arranged in the gas pipe connected to the gas nozzle 100 in order to control the gas discharge, and a junction 102 arranged upstream of the gas control valve 101 for connection with a gas cylinder 103 or the like. Incidentally, while the SEM device is configured to be equipped with the gas cylinder 103 in the example of FIG. 2, the gas cylinder 103 may either be installed previously as a built-in component or attached later by the user of the device.

The electron beam emitted from the lower end of the electronic optical body tube 2 passes through the first space 11 maintained in a high vacuum state, passes through the thin film 13, and then enters the second space 12 maintained in the atmospheric pressure or in a lower vacuum state (compared to the first space 11). However, the mean free path of the electron beam becomes shorter in the lower vacuum space due to the scattering by the gas molecules. Thus, a long distance between the thin film 13 and the sample 6 makes it difficult for the electron beam or the secondary electrons or reflected electrons caused by the electron beam irradiation to reach the sample 6. Meanwhile, the scattering probability of the electron beam is proportional to the mass number of the gas molecules. Therefore, if the second space is replaced with light gas molecules having a smaller mass number compared to the atmospheric air, the scattering probability of the electron beam decreases and the electron beam is allowed to reach the sample 6. For this reason, it is preferable to configure the SEM device so that the supply of the replacement gas to the second space 12 is possible. As for the type of the replacement gas, the effect of improving the image S/N can be achieved as long as a gas lighter than the atmospheric air is used (nitrogen gas, water vapor, etc.). The image S/N improvement effect is enhanced by use of still lighter gases such as helium gas and hydrogen gas.

In cases of observing a sample containing moisture (water), it is undesirable, from the viewpoint of preventing the evaporation of water from the sample, to turn the atmosphere of the sample before discharging light element gas into the vacuum state. Therefore, it is desirable to supply light element gas to the second space 12 in the state in which the gas outlet 120 is connected to the atmospheric air as the external space 901 of the device 900. The light element gas can be confined in the second space 12 efficiently by supplying the light element gas to the second space 12 and thereafter closing the gas outlet 120.

The gas outlet 120 may also be configured like a safety valve that automatically opens when the pressure is 1 atom or higher. With such a configuration, when the pressure of the inside of the device being supplied with the light element gas reaches 1 atom, the gas outlet 120 opens automatically and discharges the atmospheric components (nitrogen, oxygen, etc.) to the outside of the device, by which the inside of the device can be filled with the light element gas. Incidentally, the function of supplying the replacement gas to the second space 12 is not necessarily essential; it is possible to leave out the gas nozzle 100, the gas control valve 101, the junction 102, the gas cylinder 103 and the gas outlet 120.

The second space 12 may also be configured so that vacuum evacuation by an unshown vacuum pump is possible.

While the blocking part 122 is formed on the left-hand side in FIG. 2, the blocking part 122 may also be formed in a lower part or on the right-hand side in FIG. 2. The configuration shown in FIG. 2 is just an illustrative example.

Figure 3:
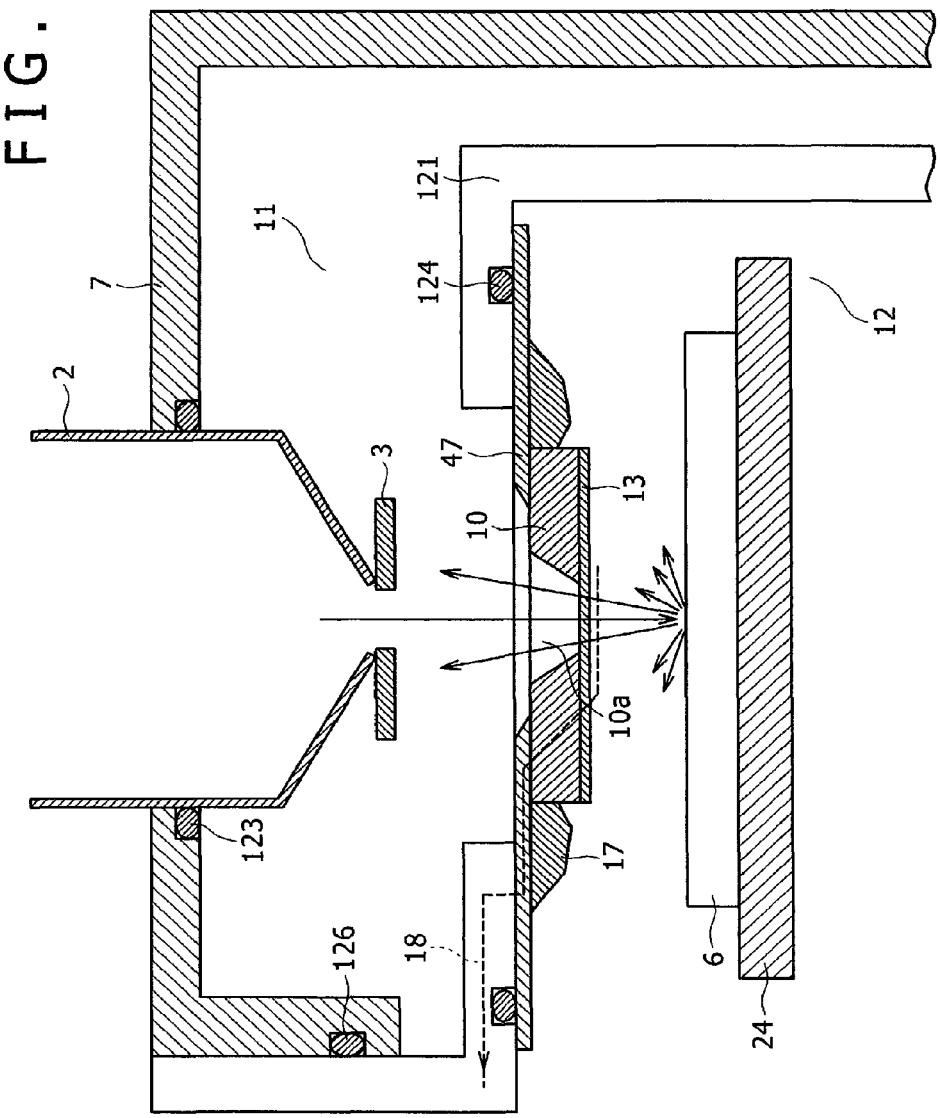
FIG. 3 is an example of a detailed diagram of a part in the vicinity of a thin film in accordance with the second embodiment of the present invention.

An example of a detailed diagram of the part in the vicinity of the thin film 13 is shown in FIG. 3, wherein illustration of the blocking part 122 and the sample stage 5 is omitted. A separation part for the separation between the first space 11 and the second space 12 is formed by the separation part 121, the thin film holding part support 47, and the thin film holding part 10 provided with the thin film 13. Preferably, the thin film holding part support 47 and the thin film holding part 10 are formed as a partition wall part. Even though the partition film has to be replaced when the partition film is damaged by erroneous contact of the thin film 13 with the sample 6, this configuration makes it possible to easily replace the thin film holding part support 47 together with the thin film holding part 10 attached thereto. If the workability, easiness of replacement, etc. are not taken into account, the thin film holding part support 47 and the thin film holding part 10 may also be formed integrally.

Figure 4:
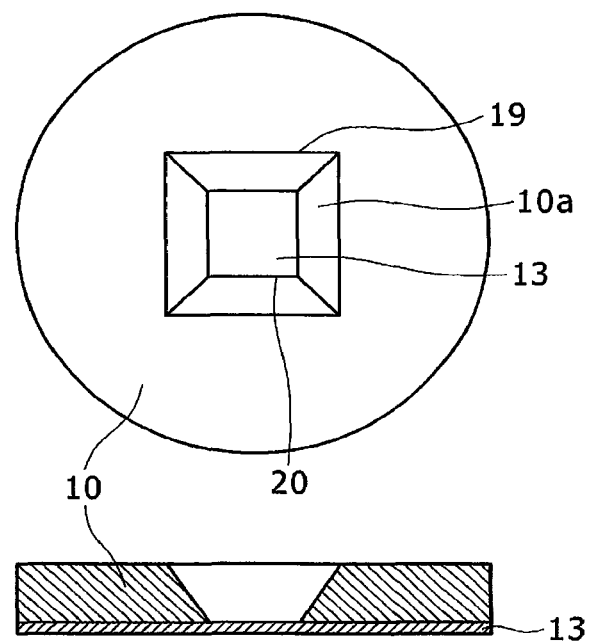
FIG. 4 is a schematic diagram showing a first example of a thin film holding part provided with the thin film in accordance with the second embodiment of the present invention.

FIG. 4 shows a first example of the thin film holding part 10 provided with the thin film 13. As shown in FIG. 4, the inner side wall of the opening part 10a of the thin film holding part 10 is formed in a tapered shape so that the opening area of the opening 19 on the first space 11's side become larger than the opening area of the opening 20 on the second space 12's side. The thin film 13 is arranged on the second space 12's side of the thin film holding part 10.

Figure 5:
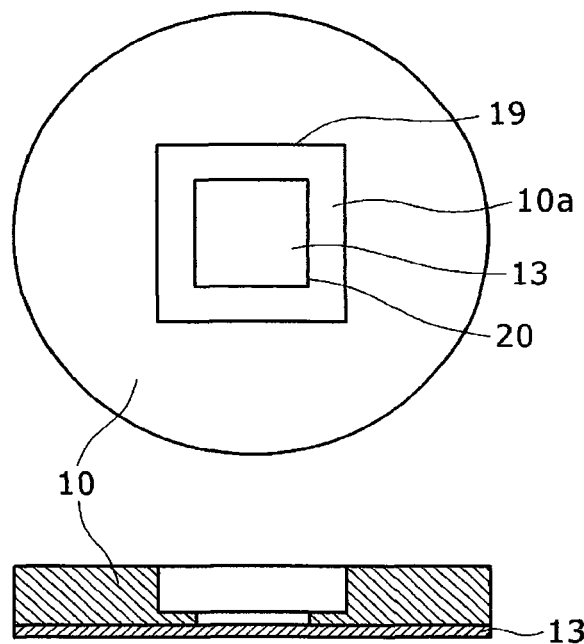
FIG. 5 is a schematic diagram showing a second example of the thin film holding part provided with the thin film in accordance with the second embodiment of the present invention.

FIG. 5 shows a second example of the thin film holding part 10 provided with the thin film 13. As shown in FIG. 5, a level difference (step) is formed on the inner side wall of the opening part 10a of the thin film holding part 10 so that the opening area of the opening 19 on the first space 11's side becomes larger than the opening area of the opening 20 on the second space 12's side. The thin film 13 is arranged on the second space 12's side of the thin film holding part 10.

Figure 6:
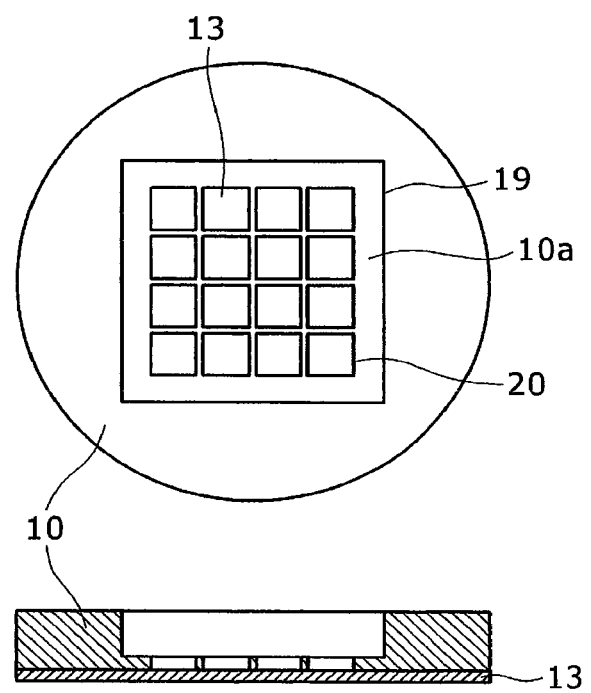
FIG. 6 is a schematic diagram showing a third example of the thin film holding part provided with the thin film in accordance with the second embodiment of the present invention.

FIG. 6 shows a third example of the thin film holding part 10 provided with the thin film 13.

The opening area of the opening 20 of the thin film holding part 10 on the second space 12's side has to be small from the viewpoint of durability since the thin film 13 is extremely thin in order to allow through the electron beam. Therefore, the SEM observation with a low magnification power can become difficult. In consideration of this problem, it is more preferable to form a level difference (step) on the inner side wall of the opening part 10a of the thin film holding part 10 and provide the thin film holding part 10 with a dividing part which divides the opening 20 on the second space 12's side into a plurality of openings as shown in FIG. 6. With this configuration, the durability of the thin film can be increased and the observable area can be widened. Although not illustrated in FIG. 6, the inner side wall of the opening part 10a may also be formed in a tapered shape. Either way, by making the opening 19 on the first space 11's side (upper side in FIG. 6) be larger than each of the openings 20 on the second space 12's side (lower side in FIG. 6), the emission electrons from the sample 6 can be collected into the detector 3 efficiently.

While the opening part 10a is illustrated in a quadrangle shape in the above first through third examples shown in FIGS. 4-6, the opening part 10a may be formed in any shape (e.g., circular shape).

As shown in FIG. 3, the thin film holding part 10 and the thin film holding part support 47 are fixed on a fixation member 17. The hermeticity of the first space 11 may be maintained either by the fixation member 17 or by sufficiently flattening the lower surface of the thin film holding part support 47 and the upper surface of the thin film holding part 10 in FIG. 3. In the latter case, the fixation member 17 is not absolutely necessary.

The hermeticity of the first space 11 between the thin film holding part support 47 and the separation part 121 is maintained by use of a vacuum sealing member 124 such as an O-ring or packing. An electrically conductive or semiconductive adhesive agent or the like may also be used as the fixation member 17. Pressing in the horizontal direction in FIG. 3 by use of metal plates or the like is also possible although not illustrated. The separation part 121 and the thin film holding part support 47 may be fixed together by use of fixation members such as screws or bolts although not shown in FIG. 3. The fixation members such as screws or bolts are dispensable since the thin film holding part support 47 can be drawn toward the separation part 121 by the negative pressure of the vacuum-evacuated first space 11.

The thin film 13 has to be attached to the lower surface of the thin film holding part 10 in FIG. 3. This configuration makes it possible to set the distance between the sample 6 and the thin film 13 as short as possible.

In cases where the thin film 13 allowing through the electron beam is made of an insulator, for example, the thin film 13 hit by the secondary electrons or reflected electrons from the sample 6 is electrically charged. This electrical charging disturbs the scanning of the electron beam, and consequently, the image observation of the sample 6 becomes almost impossible in the practical use (a problem not at all considered in the Patent Literatures 1-3). To resolve this problem, the separation part 121 and the thin film holding part support 47 are formed of conductive or semiconductive materials. Alternatively, this purpose may also be achieved by just applying a conductive or semiconductive material on the surfaces of the separation part 121 and the thin film holding part support 47. Irrespective of the type of the thin film 13, the thin film holding part 10 has to be formed as a metallic or semiconductive part. Alternatively, this purpose may also be achieved by just applying a conductive or semiconductive material on the surface of the thin film holding part 10. In short, at least part or all of the surface of the thin film holding part 10 is formed of a conductive or semiconductive material. For eliminating the electrical charging, the part of the thin film holding part 10 formed of the conductive or semiconductive material is made in contact with the thin film 13 and the second separation part 121. With this configuration, electric charges accumulated in the thin film 13 can be released through an antistatic path 18. To sum up, the configuration shown in FIG. 3 makes it possible to ground the thin film holding part 10 and allow the thin film holding part 10, the thin film 13 and part of the first housing 7 and/or the second housing 8 (e.g., the thin film holding part support 47) to be directly or indirectly in electrical contact with one another, by which the electrical charging of the thin film 13 can be prevented.

The thin film holding part support 47 is fixed on the fixation member 17 as shown in FIG. 3. When the electron beam passing through the thin film 13 flies out to the atmospheric pressure space, the electron beam undergoes the scattering by the atmospheric air. As a result, the beam diameter of the electron beam becomes extremely large when the electron beam reaches the sample 6. Thus, in order to allow the electron beam to reach the sample 6 while maintaining a prescribed electron beam diameter, the distance between the sample 6 and the thin film 13 has to be set as short as possible (a problem not described or suggested at all in the Patent Literatures 1-3). If the fixation member 17 protrudes toward the second space 12 more than the thin film 13, the sample 6 might make contact with the fixation member 17 when the sample 6 is moved toward the thin film 13. Therefore, it is preferable to arrange the fixation member 17 on the first space 11's side compared to the lower surface of the thin film 13. In other words, it is preferable to configure the fixation member 17 so that the distance between the fixation member 17 and the sample 6 becomes longer than the distance between the thin film 13 and the sample 6. This configuration allows to set the distance between the sample 6 and the thin film 13 as short as possible.

Figure 7:
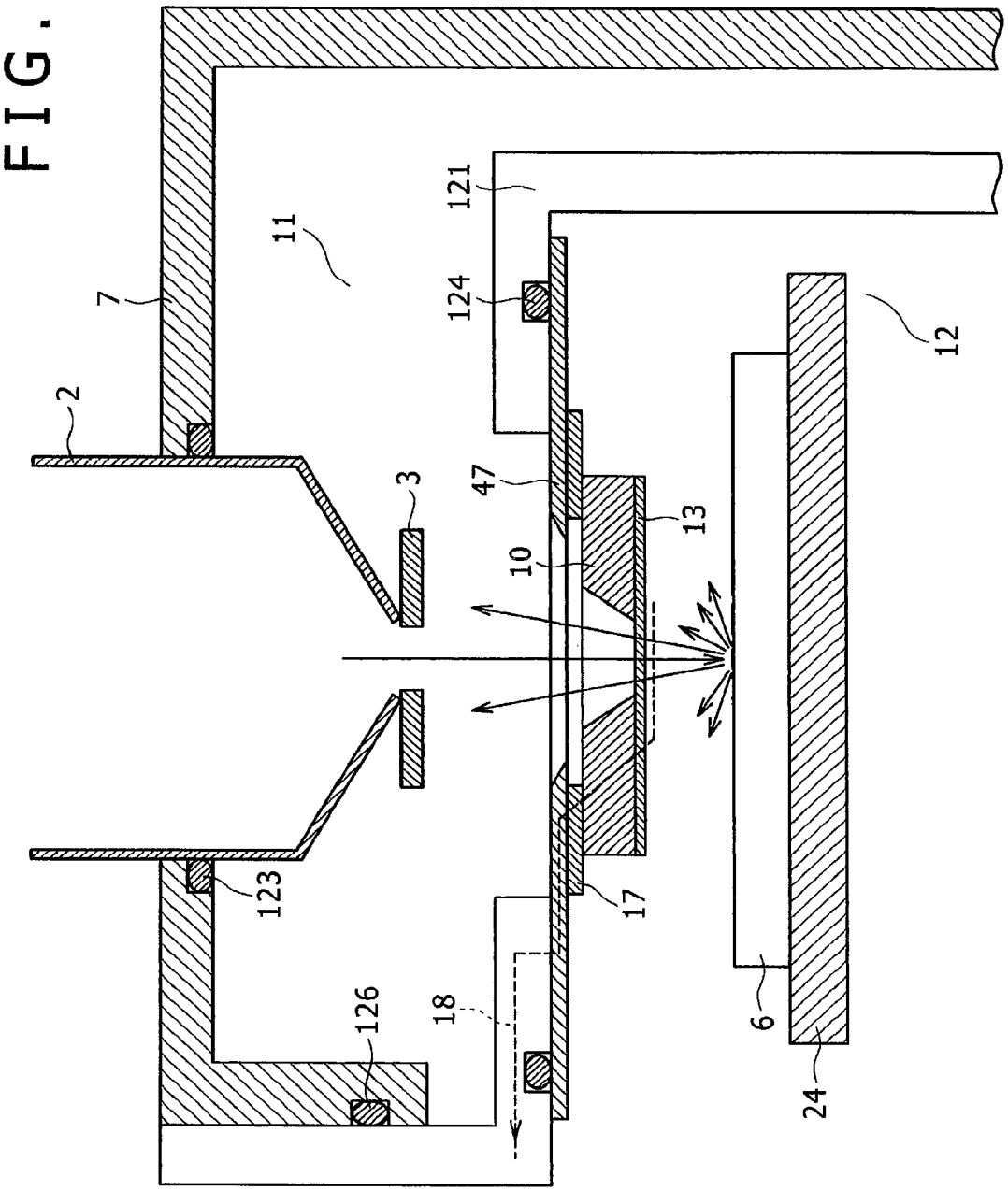
FIG. 7 is a schematic diagram showing an example in which a fixation member is arranged between the thin film holding part and a thin film holding part support in accordance with the second embodiment of the present invention.

It is also possible to arrange the fixation member 17 between the thin film holding part 10 and the thin film holding part support 47 as shown in FIG. 7. Since electric charges accumulated in the thin film holding part 10 have to be released as mentioned above, the fixation member 17 shown in FIG. 7 is formed of a conductive or semiconductive material and formed to be capable of maintaining the hermeticity between the first space 11 and the second space 12. This configuration allows to set the distance between the thin film 13 and the sample 6 as short as possible.

Figure 8:
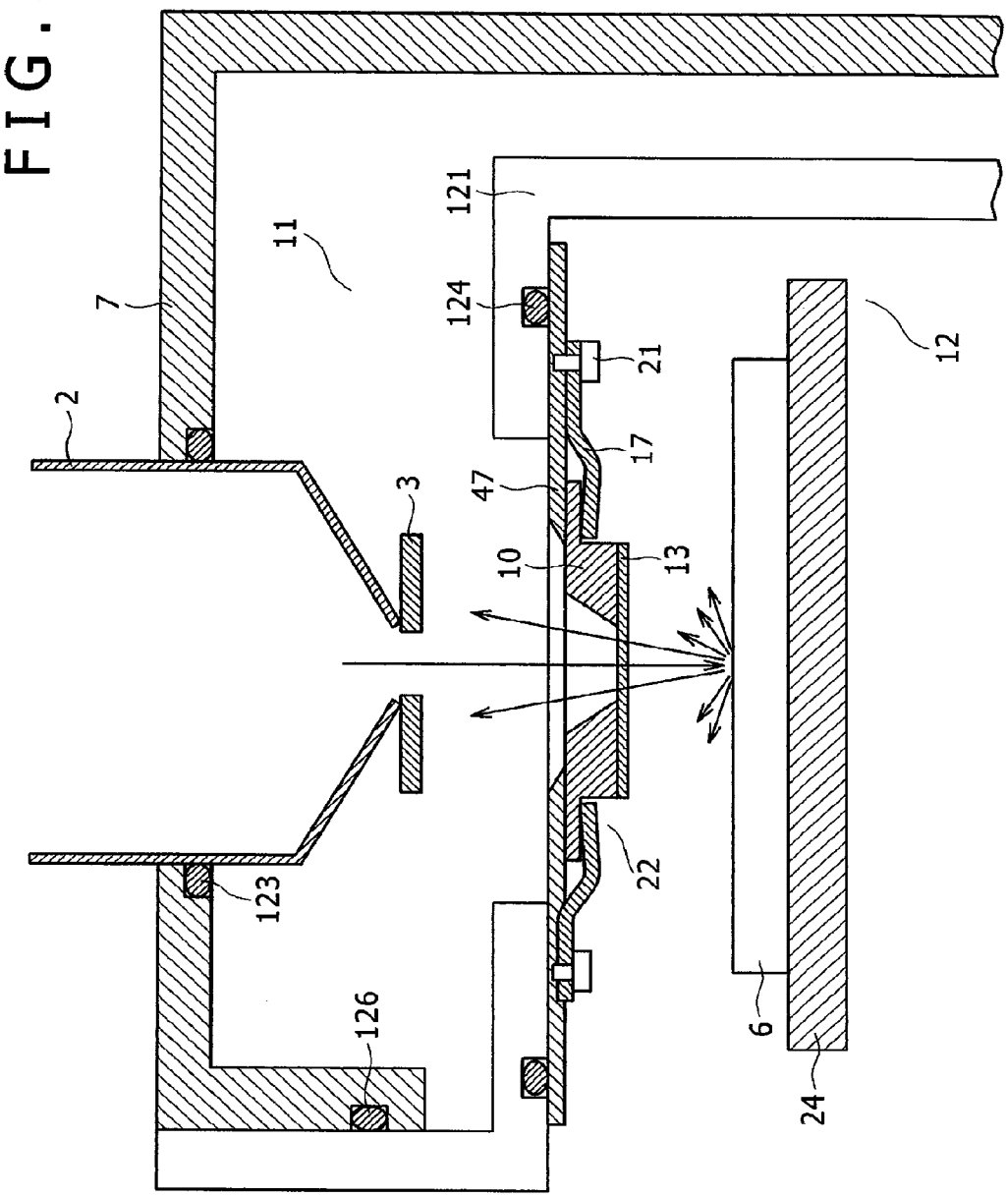
FIG. 8 is a schematic diagram showing a modified example in which the fixation member is arranged between the thin film holding part and the thin film holding part support in accordance with the second embodiment of the present invention.

FIG. 8 shows a modified example of the thin film holding part 10, wherein the peripheral edge of the thin film holding part 10 is provided with at least one level difference part 22 as a positioning part, and the thin film holding part is fixed by use of the level difference. As shown in FIG. 8, the level difference part 22 is formed on the exterior lateral wall of the thin film holding part 10 so that the fixation member is arranged between the level difference part 22 and the thin film holding part support 47. The fixation member 17 may be implemented by a metallic plate, a tape or an adhesive agent. While fixation screws 21 for fixing the fixation member 17 and the thin film holding part support 47 together are shown in FIG. 8, the use and the shape of the fixation screws 21 are optional. However, it is preferable that the fixation member 17 and the fixation screws 21 be arranged on the first space 11's side compared to the lower surface of the thin film 13. In this case, the hermeticity of the first space 11 can be maintained by making the contacting parts of the thin film holding part 10 and the thin film holding part support 47 be in close contact with each other (e.g., by sufficiently flattening the upper surface of the thin film holding part 10 and the lower surface of the thin film holding part support 47 in FIG. 8). Although not illustrated, the level difference part 22 may have two or more level differences. The position of the level difference part 22 is not restricted (e.g., on the lower surface of the thin film holding part 10. With this configuration, the thin film holding part 10 can be replaced more easily compared to the example of FIG. 7.

<Third Embodiment>

Figure 9:
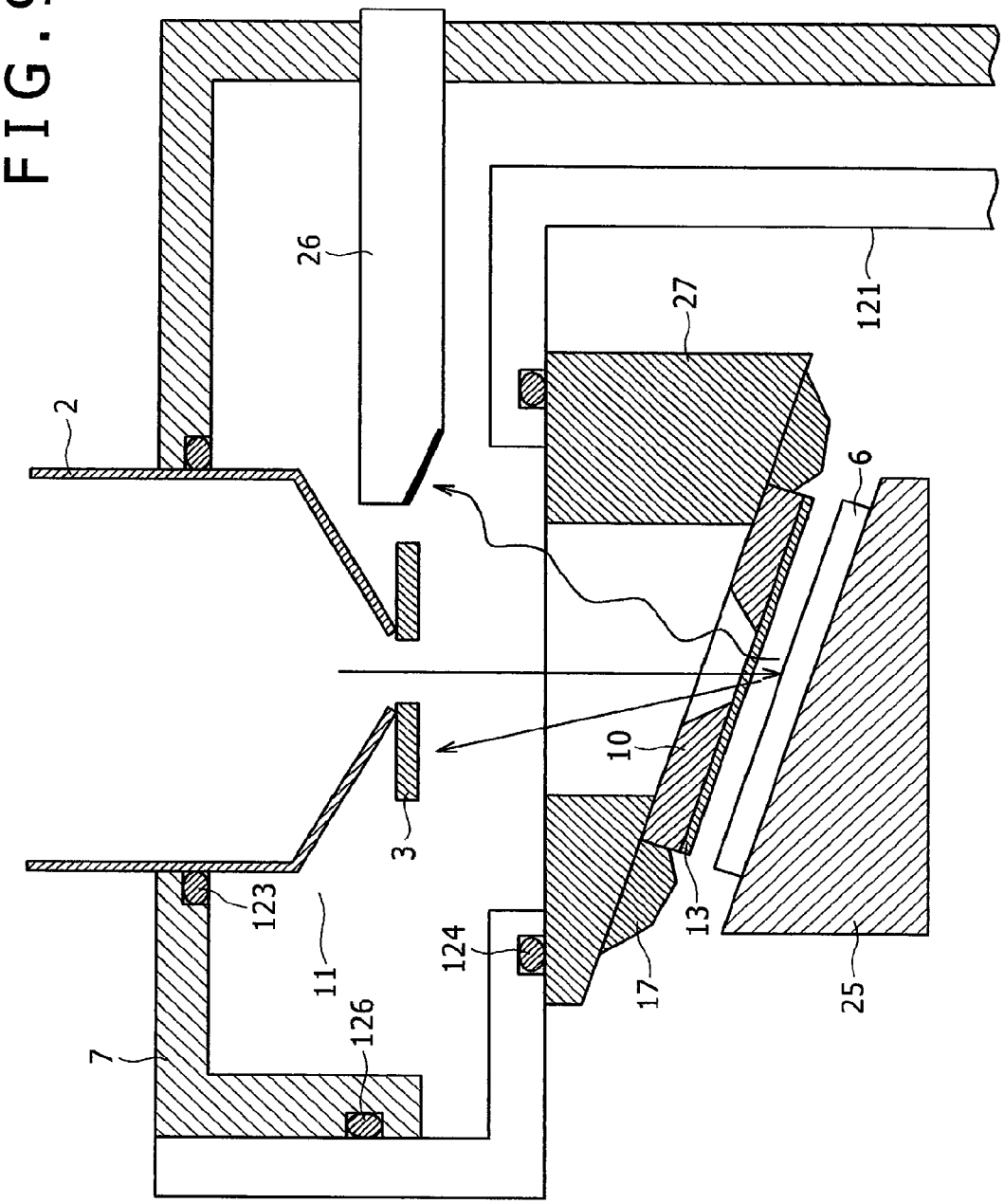
FIG. 9 is a schematic diagram showing an embodiment in which the microscope observation is performed on a sample in a tilted state as a third embodiment of the present invention.

Next, an embodiment in which the microscope observation is performed on a sample in a tilted state will be described referring to FIG. 9 as a third embodiment of the present invention.

This embodiment differs from the first and second embodiments in that the sample 6 is mounted on a tilted sample table 25 and the thin film holding part 10 is attached to a thin film holding part support 27 which is formed as a partition wall part having a tilted part. The other features are equivalent to those in the first and second embodiments.

It is difficult to simply tilt the sample 6 since the distance between the sample 6 and the thin film 13 is desired to be as short as possible as mentioned above. Therefore, the sample 6 is mounted on the sample table 25 whose upper surface as the mount for the sample is tilted as shown in FIG. 9 and the thin film holding part 10 is attached to the thin film holding part support 27 having the tilted part so that the sample mount surface of the sample table 25 becomes in parallel with the surface of the thin film 13 facing the sample mount surface. With such a configuration, the electron beam can be applied to the tilted sample 6 and images of the tilted sample 6 can be acquired. Further, in cases where the device is equipped with a detector 26 other than the detector 3, it is possible to allow the signal to efficiently enter the detector 26 as shown in FIG. 9. The detector 26 may be implemented by an X-ray detector, a photon detector, etc.

<Fourth Embodiment>

Figure 10:
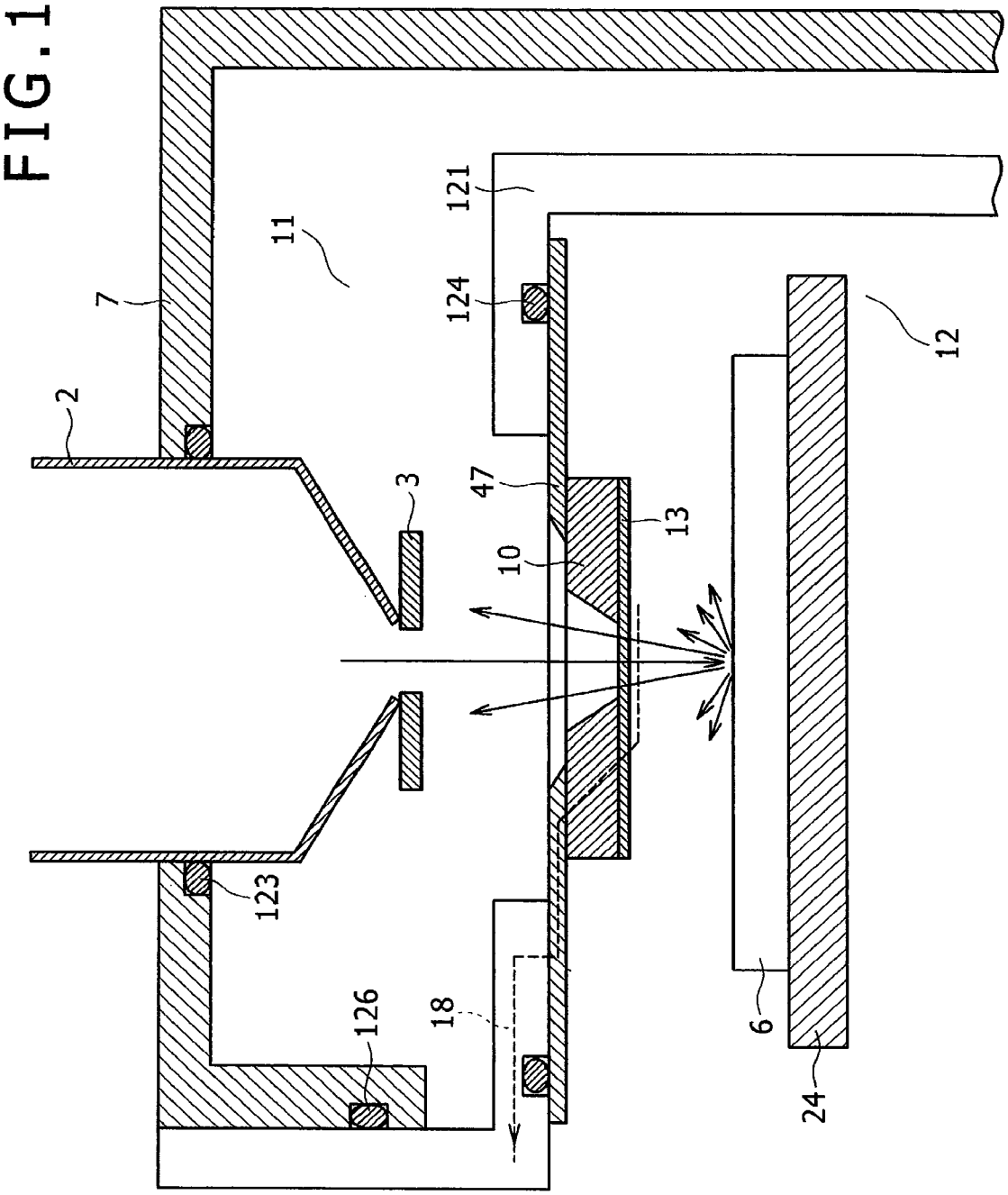
FIG. 10 is a schematic diagram showing an embodiment for holding the thin film holding part as a fourth embodiment of the present invention.

Next, an embodiment in which the thin film holding part 10 is held by taking advantage of the vacuum evacuation of the first space 11 will be described referring to FIG. 10 as a fourth embodiment of the present invention.

Figure 11:
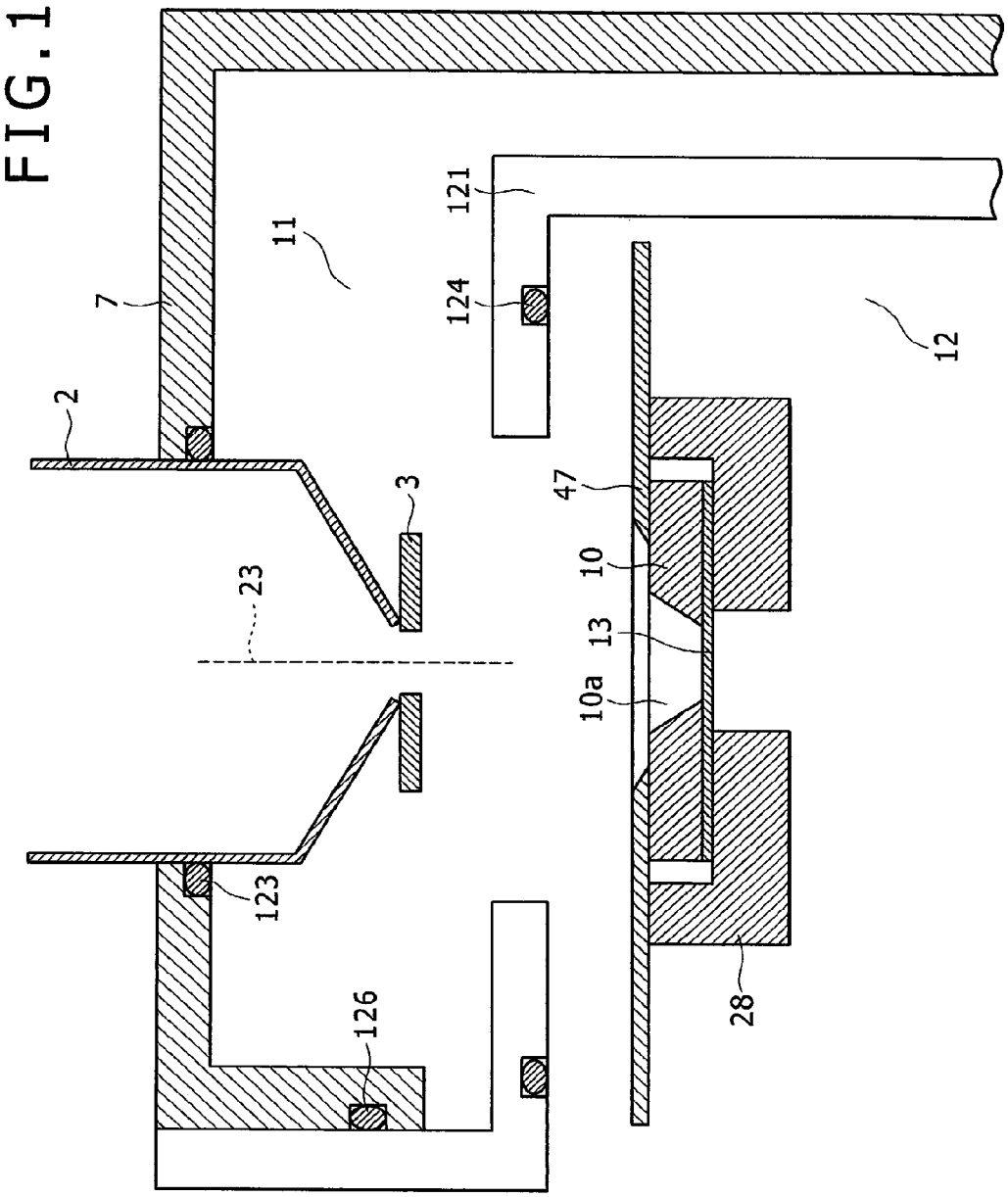
FIG. 11 is a schematic diagram showing an embodiment employing a table in accordance with the fourth embodiment of the present invention.

This embodiment differs from the first and second embodiments in that the thin film holding part 10 is held not by use of the fixation member 17 but by taking advantage of the vacuum evacuation of the first space 11. The other features are equivalent to those in the first and second embodiments. As shown in FIG. 10, it is possible to equip the thin film holding part support 47 with the thin film holding part 10 by taking advantage of the vacuum evacuation of the first space 11, without using the fixation member 17. In this case, the hermeticity of the first space 11 can be maintained by sufficiently flattening the upper surface of the thin film holding part 10 and the lower surface of the thin film holding part support 47 in FIG. 10 as explained in the second embodiment, etc. For the attachment, the following method shown in FIG. 11 can be employed, for example: When the first space 11 and the second space 12 are in the same pressure status, the thin film holding part 10 and the thin film holding part support 47 are mounted on a table 28 having a bored part at a position facing the opening part 10a for the thin film 13. Thereafter, the thin film holding part support 47 is brought into contact with the separation part 121 and the vacuum evacuation of the first space 11 is performed. By the vacuum evacuation, the thin film holding part 10 and the thin film holding part support 47 adhere to each other in vacuum adsorption and the configuration shown in FIG. 10 is formed. It is possible to mount the sample stage 5 on the table 28, or to mount the table 28 on a different drive mechanism although not illustrated. With this configuration, the replacement of the thin film holding part 10 is facilitated. In the example of FIG. 11, the thin film holding part support 47 may also be previously attached to the separation part 121. It is also possible to employ the fixation member 17 as a style of use of the table 28. The shape of the table 28, having the bored part at the position facing the opening part 10a for the thin film 13, is just an example; it is also possible (instead of boring the center of the table 28 facing the opening part 10a for the thin film 13) to form a level difference to allow the part of the table 28 facing the opening part 10a to recede. Further, the table 28 shown in FIG. 11 may also be configured to have some level differences on its upper surface, side surface, etc.

<Fifth Embodiment>

A fifth embodiment of the present invention will be described below referring to FIG. 12. This embodiment differs from the first embodiment, etc. in that the device is configured to have a level difference part 22 capable of changing the relative position between the electronic optical body tube 2 and the thin film 13 in the horizontal direction in FIG. 12 and/or a positioning part capable of moving the thin film 13 in the direction orthogonal to the sheet of FIG. 12. The other features are equivalent to those in the other embodiments.

There also exists a problem (not described or suggested in the Patent Literatures 1-3) that it is totally impossible to align the center of the thin film with the axis of the SEM optical system by just applying the thin film on the part under the SEM body tube and facing the sample.

The opening 20 of the thin film holding part 10 on the second space 12's side is extremely small since the thin film 13 is extremely thin in order to allow through the electron beam. On the other hand, the attachment of the thin film holding part support 47 and the thin film holding part 10 including the thin film 13 can result in misalignment between the optical axis 24 and the center of the thin film 13. Therefore, it is essential to adjust the position of the thin film 13 while observing the thin film 13 and the thin film holding part 10 through the electron microscope after the attachment of the thin film 13, etc.

Figure 12:
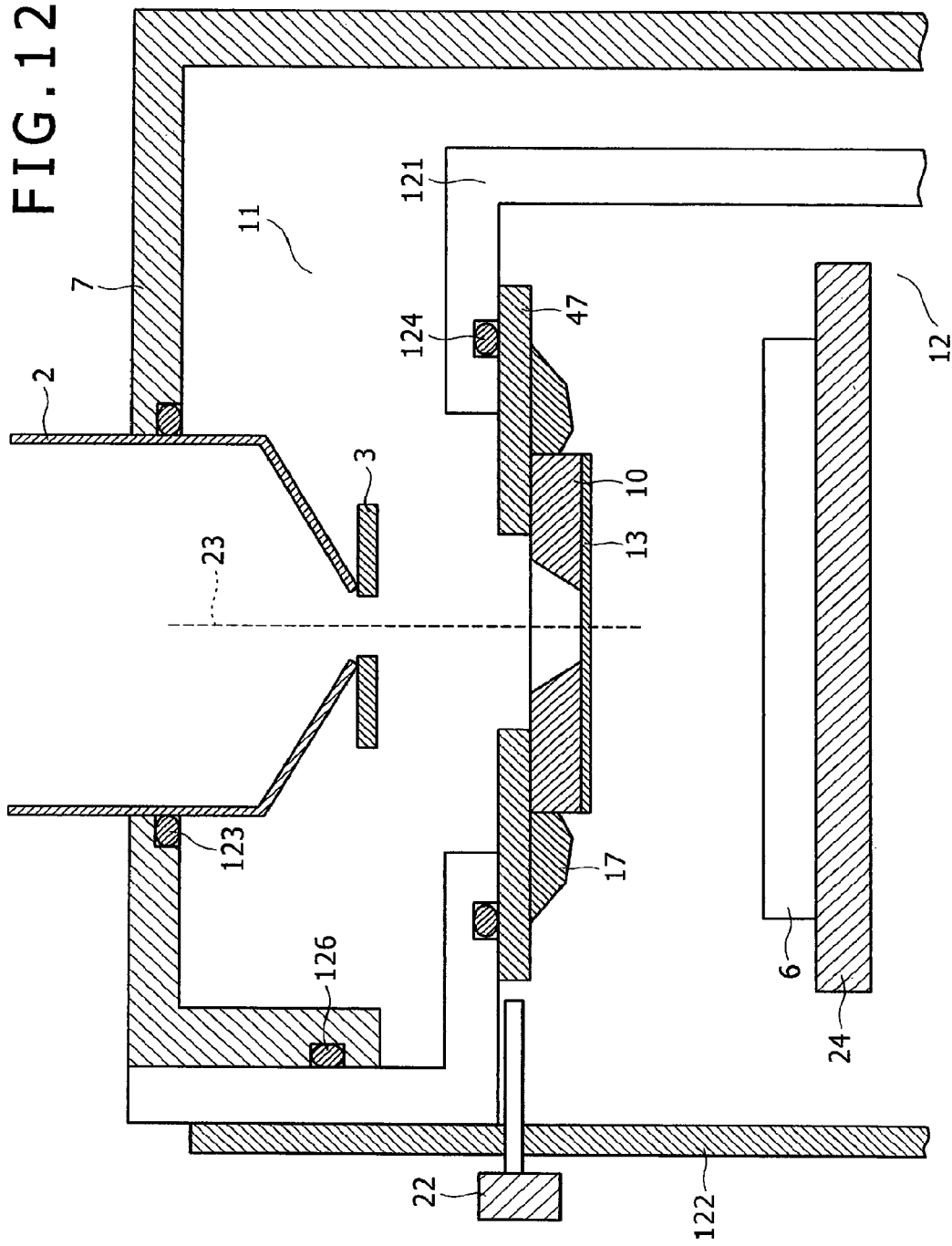
FIG. 12 is a schematic diagram showing a fifth embodiment of the present invention.

In the example of FIG. 12, the device is equipped with the level difference part 22 capable of changing the relative position between the electronic optical body tube 2 and the thin film 13 in the horizontal direction in FIG. 12 and/or (although not illustrated) the positioning part capable of moving the thin film 13 in the direction orthogonal to the sheet of FIG. 12. With this configuration, the alignment between the optical axis 24 and the center of the thin film 13 is possible. Further, equipping the device with a positioning mechanism for changing the position of the thin film holding part 10 makes it possible to change the position of the thin film 13 while observing the image.

Incidentally, while the level difference part 22 is arranged in the blocking part 122 which is easily accessible to the device user in the example of FIG. 22, it is unnecessary to arrange the level difference part 22 in the blocking part 122 if the level difference part 22 is driven by use of a motor or the like capable of automatically driving the level difference part 22. Further, while the positioning is carried out by directly changing the position of the thin film holding part support 47, the position may be changed indirectly by using a different component.

<Sixth Embodiment>

Figure 13:
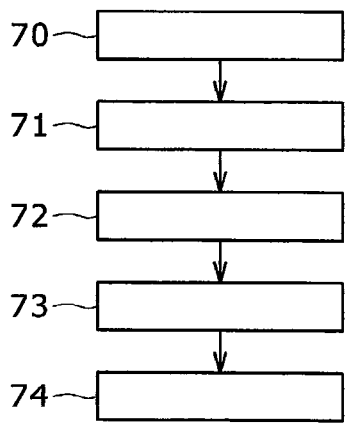
FIG. 13 is a flow chart showing a sixth embodiment of the present invention.

Next, a six embodiment of the present invention, as an application of the configuration comprising the positioning part explained in the fifth embodiment, will be described referring to FIG. 13. In this embodiment, the device configuration (as the configuration comprising the positioning part described in the fifth embodiment) is applicable also to the configurations shown in FIGS. 3, 7, 8 and 9. FIG. 13 is a flow chart showing a procedure for the attachment of the thin film holding part 10 and the positioning of the thin film 13.

As shown in FIG. 13, in the first step 70, the thin film holding part 10 to which the thin film 13 has been fixed is attached to the thin film holding part support 47 by using the fixation member 17. The thin film 13 is arranged on the sample 6's side.

In the second step 71, the thin film holding part support 47 to which the thin film holding part 10 with the thin film 13 has been attached is brought into contact with the separation part 121 (which is used as part of the members for the separation between the first space 11 and the second space 12), and the vacuum evacuation of the first space 11 is conducted.

In the third step 72, the electron beam emission is started.

In the fourth step 73, an electron microscope image is displayed and the position of the thin film 13 in the image is checked.

In the fifth step 74, while checking the position of the thin film 13 in the electron microscope image, the adjustment (positioning) is performed by using the level difference part 22 so as to bring the position of the thin film 13 to the center of the image.

The procedure from the third step 72 to the fifth step 74 shown in FIG. 13 can be automated in the case where the level difference part 22 is driven by use of a motor or the like capable of automatically driving the level difference part 22.

<Seventh Embodiment>

Figure 14:
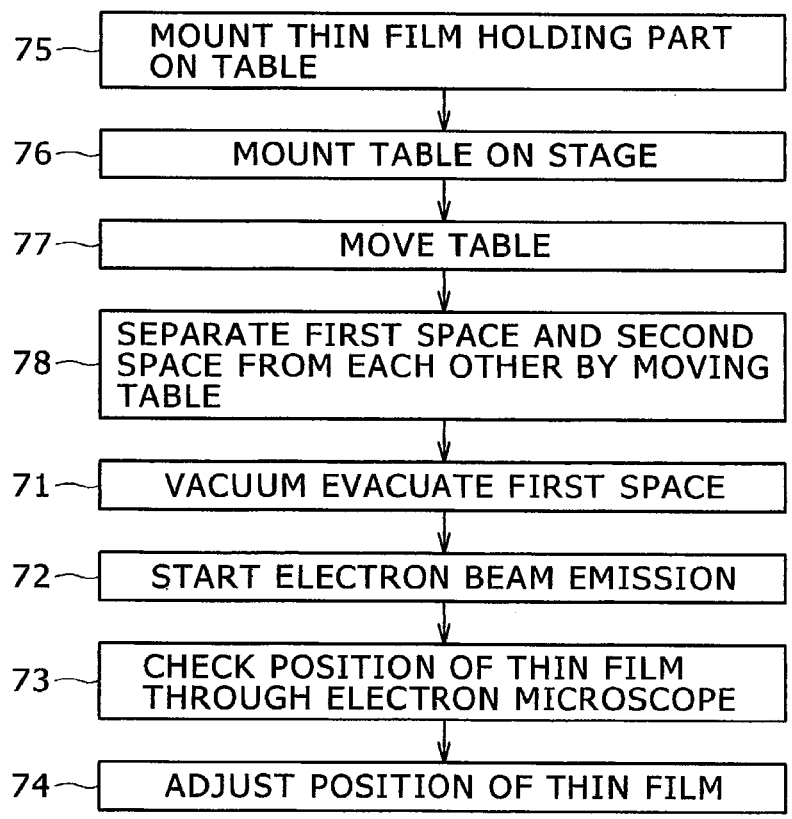
FIG. 14 is a flow chart showing a seventh embodiment of the present invention.

Next, a seventh embodiment of the present invention will be described referring to a flow chart of FIG. 14. This embodiment is an example of application of the configuration comprising the positioning part explained in the fifth embodiment of the present invention to the method using the table 28 explained in the fourth embodiment referring to FIG. 11.

A method for attaching the thin film holding part 10, etc. by using the table 28 (as the mount for the thin film holding part 10) shown in FIG. 11 and a procedure for the positioning will be explained below referring to FIG. 14. The following explanation will be given on the assumption that the table 28 (used as the mount for the thin film holding part 10) is mounted on the sample stage 5 which is used as the mount for the sample 6.

In the first step 75, the thin film holding part 10 and the thin film holding part support 47 are mounted on the table 28 having the bored part at the center. In this case, the centers of the thin film holding part 10 and the thin film holding part support 47 are previously aligned with each other. In the aforementioned case where the thin film holding part support 47 has previously been attached to the separation part 121, only the thin film holding part 10 is mounted on the table 28.

In the second step 76, the table 28 on which the thin film holding part 10 has been set is mounted on the sample stage 5.

In the third step 77, the sample stage 5 is moved so as to move the table 28 (on which the thin film holding part 10 has been set) to the position shown in FIG. 11, that is, to a position where the optical axis 23 of the electron beam and the center of the thin film 13 are aligned with each other to some extent.

In the fourth step 78, the first space 11 and the second space 12 are separated from each other by moving the table 28 (on which the thin film holding part 10 has been set) upward in FIG. 11.

In the fifth step 71, the vacuum evacuation of the first space 11 is conducted. Consequently, the thin film holding part 10 is integrated with the second separation part by means of the vacuum adsorption.

In the sixth step 72, the electron beam emission is started.

In the seventh step 73, the electron microscope image is displayed and the position of the thin film 13 in the image is checked.

In the eighth step 74, while checking the position of the thin film 13 in the electron microscope image, the position of the thin film 13 can be brought to the center of the image by using the level difference part 22.

Incidentally, while the first and second spaces 11 and 12 are separated from each other by moving the thin film holding part 10 when both the first and second spaces 11 and 12 are in the atmospheric state in the method explained above, it is also possible to separate the first and second spaces 11 and 12 from each other by moving the thin film holding part 10 when both the first and second spaces 11 and 12 are in the vacuum state and thereafter bring the second space 12 to the atmospheric pressure state.

DESCRIPTION OF REFERENCE CHARACTERS 0 charged particle source
1 optical lens
2 electronic optical body tube
3 detector
4 vacuum evacuation pump
5 sample stage
6 sample
7 first housing
8 second housing
10 thin film holding part
11 first space
12 second space
13 thin film
17 fixation member
18 antistatic path
19 opening on the first space's side
20 opening on the second space's side
22 level difference part
23 optical axis
70, 71, 72, 73, 74, 75, 76, 77, 78 step
120 gas outlet

The invention claimed is:

1. A charged particle beam device comprising:
a charged particle irradiation unit which irradiates a sample with a primary charged particle beam emitted from a charged particle source;
a first housing which is configured to support the charged particle irradiation unit and maintain an inside of the first housing in a vacuum state;
a second housing which is provided in addition to the first housing and houses the sample;
an evacuation device which evacuates the inside of the first housing;
a detector which detects a charged particle beam obtained by the irradiation in the first housing;
a partition wall that separates the inside of the first housing and an inside of the second housing from each other at least along part of an interface between the first and second housings and which is formed as at least part of either the first or second housing or is separate from the first and second housings;
a thin film which transmits the primary charged particle beam and secondary electrons obtained by irradiation of the sample with the primary charged particle beam;
a thin film holding part which holds the thin film;
a thin film holding part support which extends from the partition wall to further separate the inside of the first housing and the inside of the second housing from each other, and supports the thin film holding part; and
a fixation member which fixes the thin film holding part to the thin film holding part support and protrudes into the inside of the second housing,
wherein the thin film is held by the thin film holding part to protrude from the thin film holding part toward the inside of the second housing, and
wherein the fixation member is disposed to protrude toward the inside of the second housing more than the thin film holding part support and less than the thin film.

2. The charged particle beam device according to claim 1, wherein the fixation member is disposed in a space of the second housing which is in an upper side of the thin film.

3. The charged particle beam device according to claim 1, wherein fixation member is disposed such that a distance between the fixation member and a portion of the sample directly under the fixation member is longer than a distance between the thin film and the sample.

4. The charged particle beam device according to claim 1, wherein the thin film holding part support is electrically connected to at least part of the first or second housing.

5. The charged particle beam device according to claim 1,
wherein the thin film holding part comprises an opening part having an opening area on the charged particle irradiation unit side that is greater than an opening area on the sample side,
wherein an inner side wall of the opening part is formed in a tapered shape.

6. The charged particle beam device according to claim 1,
wherein the thin film holding part comprises an opening part having an opening area on the charged particle irradiation unit side that is greater than an opening area on the sample side,
wherein the opening part has a stepped inner side wall.

7. The charged particle beam device according to claim 1,
wherein the thin film holding part comprises an opening part having an opening area on the charged particle irradiation unit side that is greater than an opening area on the sample side, and further comprises: a dividing part disposed in the opening part which divides the opening part on the sample side into a plurality of openings.

8. The charged particle beam device according to claim 4, wherein the thin film and at least part of the first or second housing are electrically connected.

9. The charged particle beam device according to claim 1, wherein:
at least part or all of the surface of the thin film holding part is formed of a conductive or semiconductive material.

10. The charged particle beam device according to claim 1,
wherein the thin film holding part and contacting parts of the thin film holding part support are in close contact with each other.

11. The charged particle beam device according to claim 1, wherein:
a peripheral edge of the thin film holding part is provided with at least one level difference part, and the thin film holding part is fixed by use of the level difference part.

12. The charged particle beam device according to claim 1, further comprising a moving mechanism which moves the sample towards the charged particle irradiation unit.

13. The charged particle beam device according to claim 12, wherein the moving mechanism is a sample stage as a mount for the sample.

14. The charged particle beam device according to claim 1, comprising a positioning mechanism for adjusting the position of the thin film.

15. The charged particle beam device according to claim 14, wherein the positioning mechanism is arranged in a blocking part which blocks a sample gateway of the second housing.

16. The charged particle beam device according to claim 1, further comprising a sample table which is configured so that its upper surface as a mount for the sample is tilted,
  wherein the thin film holding part support is provided with a tilted part so that a sample mount surface of the sample table becomes in parallel with a surface of the thin film facing the sample mount surface.

* * * * *